(12) United States Patent
Liu (10) Patent No.: US 12,255,125 B2
(45) Date of Patent: Mar. 18, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 427 days.

(21) Appl. No.: 17/649,099

(22) Filed: Jan. 27, 2022

(65) Prior Publication Data

US 2023/0044396 A1 Feb. 9, 2023

Related U.S. Application Data

(63) Continuation of application No. PCT/CN2021/112007, filed on Aug. 11, 2021.

(30) Foreign Application Priority Data

Aug. 5, 2021 (CN) .......................... 202110898158.5

(51) Int. Cl.
  *H01L 23/48* (2006.01)
  *H01L 21/768* (2006.01)
  *H01L 23/532* (2006.01)

(52) U.S. Cl.
  CPC ...... *H01L 23/481* (2013.01); *H01L 21/76898* (2013.01); *H01L 23/53238* (2013.01); *H01L 23/53266* (2013.01); *H01L 23/53271* (2013.01)

(58) Field of Classification Search
  CPC ..... H01L 23/48; H01L 23/481; H01L 23/532; H01L 23/53238; H01L 23/53266; H01L 23/53271; H01L 21/768; H01L 21/76898

USPC .......................................................... 257/246
See application file for complete search history.

(56) References Cited

U.S. PATENT DOCUMENTS

| 8,829,646 B2 | 9/2014 | Lung | |
|---|---|---|---|
| 8,963,316 B2 | 2/2015 | Hsu | |
| 2008/0105947 A1* | 5/2008 | Kuzuhara | H01L 23/5283 257/E23.141 |
| 2010/0270593 A1 | 10/2010 | Lung | |
| 2013/0207260 A1 | 8/2013 | Hsu | |
| 2014/0214209 A1* | 7/2014 | Sugiura | B25J 9/1612 310/322 |

FOREIGN PATENT DOCUMENTS

| CN | 101123207 A | 2/2008 |
|---|---|---|
| CN | 101916754 A | 12/2010 |
| CN | 102598245 A | 7/2012 |
| CN | 103367334 B | 4/2016 |
| CN | 104724662 B | 5/2016 |
| CN | 105977203 A | 9/2016 |
| CN | 106158735 A | 11/2016 |
| CN | 107564890 A | 1/2018 |
| TW | 201612954 A | 4/2016 |

* cited by examiner

*Primary Examiner* — Chuong A Luu
(74) *Attorney, Agent, or Firm* — Syncoda LLC; Feng Ma (57) ABSTRACT

A semiconductor structure includes a substrate, a via, a conductive pillar, and a core layer. The via is located in the substrate. The conductive pillar is located in the via, and the conductive pillar is provided with a groove extended inwards from an upper surface of the conductive pillar. The core layer is located in the groove, a Young modulus of the core layer is less than that of the conductive pillar.

11 Claims, 12 Drawing Sheets

SEMICONDUCTOR STRUCTURE AND MANUFACTURING METHOD THEREOF

CROSS-REFERENCE TO RELATED APPLICATIONS

This is a continuation of International Patent Application No. PCT/CN2021/112007 filed on Aug. 11, 2021, which claims priority to Chinese Patent Application No. 202110898158.5 filed on Aug. 5, 2021. The disclosures of these applications are hereby incorporated by reference in their entirety.

BACKGROUND

With the continuous reduction in the feature size of integrated circuits and the continuous improvement of the interconnection density of devices, two-dimensional packaging may no longer satisfy the requirements of the industry. A vertical interconnection stack packaging based on Through Silicon Via (TSV) interconnection technology having advantages of short-distance interconnection and high-density integration, gradually leads the development trend of packaging technologies.

SUMMARY

The present application relates, but is not limited, to a semiconductor structure and a manufacturing method thereof.

In accordance with a first aspect of the present invention, there is provided a semiconductor structure, including a substrate, a via, a conductive pillar, and a core layer.

The via is located in the substrate.

The conductive pillar is located in the via, and the conductive pillar is provided with a groove extending inwards from an upper surface of the conductive pillar.

The core layer is located in the groove. A Young modulus of the core layer is less than that of the conductive pillar.

In accordance with a second aspect of the present invention, there is provided a manufacturing method for a semiconductor structure, and the manufacturing method includes the following operations.

A substrate is provided, and an etching process is performed on the substrate to form a via in the substrate.

A conductive pillar with a groove extending from an upper surface of the conductive pillar to the interior of the conductive pillar is formed in the via.

A core layer is formed in the groove. A Young modulus of the core layer is less than that of the conductive pillar.

DETAILED DESCRIPTION

Exemplary embodiments disclosed in the present application are described in more detail with reference to drawings. Although the exemplary embodiments of the present application are shown in the drawings, it should be understood that the present application may be implemented in various forms and should not be limited by the specific embodiments described here. On the contrary, these embodiments are provided for more thorough understanding of the present application, and to fully convey a scope disclosed in the embodiments of the present application to a person skilled in the art.

In the following descriptions, a lot of specific details are given in order to provide the more thorough understanding of the present application. However, it is apparent to a person skilled in the art that the present application may be implemented without one or more of these details. In other examples, in order to avoid confusion with the present application, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the present application, a first element, component, region, layer or section discussed below may be represented as a second element, component, region, layer or section. While the second element, component, region, layer or section is discussed, it does not mean that the first element, component, region, layer or section is necessarily existent in the present application.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the present application. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

The TSV tends to protrude out of a substrate after thermal expansion, which has a negative effect on the flatness of the substrate.

As for the vertical interconnection stacked packaging based on a TSV interconnection technology, it is to stack two or more semiconductor chips together, and achieve the signal transmission between the semiconductor chips through the TSV.

Figure 1:
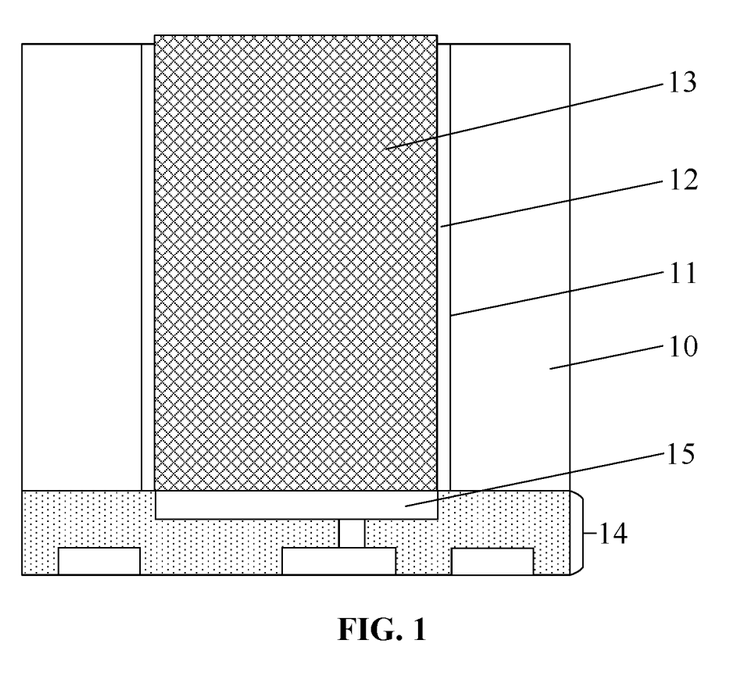
FIG. 1 is a schematic diagram of a semiconductor structure in an example.

FIG. 1 is a schematic diagram of a semiconductor structure in an example. As shown in the figure, the semiconductor structure includes a substrate 10, a via 11, an insulating layer 12, a conductive pillar 13, a redistribution layer 14 and a metal pad 15. The via 11 is located in the substrate 10. The insulating layer 12 covers a side wall of the via 11. The conductive pillar 13 is formed in the via 11, and isolated from the substrate 10 by the insulating layer 12. The redistribution layer 14 is formed on one side of the substrate 10. The metal pad 15 is formed in the redistribution layer 14, and electrically connected with the conductive pillar 13. When the semiconductor structure is bonded to other structures, the conductive pillar 13 may provide vertical interconnection between the semiconductor structure and the other structures.

When the semiconductor structure is bonded to the other structures, the semiconductor structure will be heated. However, in this process, the conductive pillar 13 is expanded due to the heat, and the expansion may produce a significant stress. The stress counter-reacts to the conductive pillar 13, and eventually the conductive pillar 13 protrude outwards from the substrate 10 due to the stress. Therefore, the flatness of the substrate 10 is reduced, and the performance of the semiconductor structure may be possibly deteriorated.

Based on this, the embodiments of the present application provides the following technical solutions.

An embodiment of the present application provides a semiconductor structure, including a substrate, a via, a conductive pillar, and a core layer. The via is located in the substrate. The conductive pillar is located in the via, and the conductive pillar is provided with a groove extended inwards from an upper surface of the conductive pillar. The core layer is located in the groove. A Young modulus of the core layer is less than that of the conductive pillar.

In this way, the core layer may alleviate the stress generated by the conductive pillar during thermal expansion, thereby the degree of an outward protruding of the conductive pillar may be reduced when the semiconductor structure heated. Therefore, flatness of the substrate is improved, and the overall performance of the semiconductor structure is improved.

In order to make the above purposes, features and advantages of the present application more apparent and understandable, the specific embodiments of the present application are described in detail below with reference to the drawings. The embodiments of the present application are described in detail as follows. For the convenience of descriptions, a schematic diagram may not be drawn to scale, and the schematic diagram is only an example, it should not limit a scope of protection of the present application here.

Figure 2A:
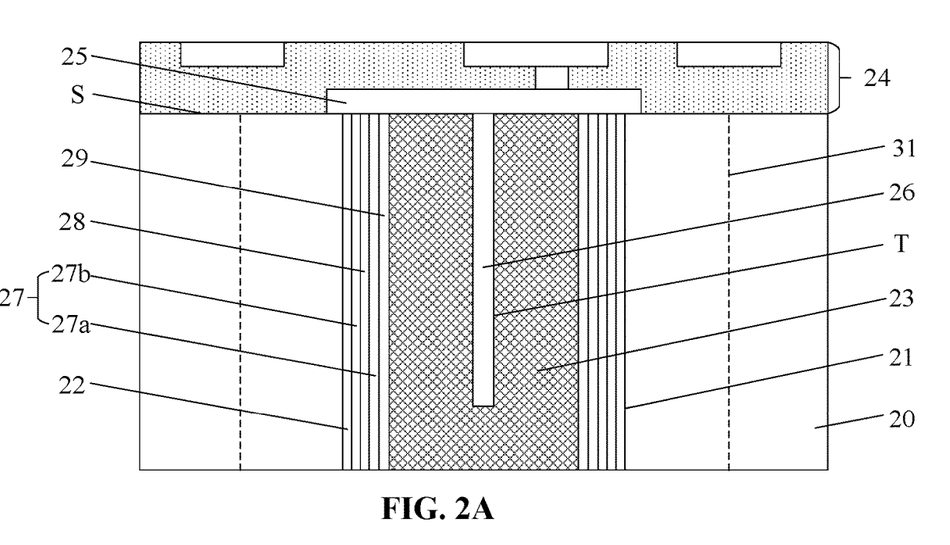
FIG. 2A is a schematic diagram of a semiconductor structure according to an embodiment of the present application.

FIG. 2A is a schematic diagram of a semiconductor structure according to an embodiment of the present application. As shown in the figure, the semiconductor structure includes a substrate 20, a via 21, a conductive pillar 23, and a core layer 26. The via 21 is located in the substrate 20. The conductive pillar 23 is located in the via 21, and provided with a groove T extending inwards from an upper surface of the conductive pillar 23. The core layer 26 is located in the groove T. A Young modulus of the core layer 26 is less than that of the conductive pillar 23.

In some embodiments, the substrate may be a silicon substrate. In some other embodiments, the substrate may include other semiconductor elements, such as germanium, or include semiconductor compounds, such as silicon carbide, gallium arsenide, gallium phosphide, indium phosphide, indium arsenide, and/or indium antimonide; or other semiconductor alloys, such as silicon germanium, gallium arsenide phosphide, indium aluminum arsenide, aluminum gallium arsenide, indium gallium arsenide, indium gallium phosphide, and/or indium gallium arsenide phosphide, or combinations thereof. In an optional embodiment, the thickness of the substrate is between 40 μm and 70 μm.

The substrate 20 includes an active surface S and a back surface opposite to the active surface S. A device is arranged in the substrate 20 close to the active surface S. In an embodiment, the device may be, but not limited to, a memory, such as a Dynamic Random Access Memory (DRAM). In other embodiments, the device may be a logic chip and the like.

In an embodiment, a redistribution layer 24 is arranged on the active surface S of the substrate 20. A metal pad 25 is arranged in the redistribution layer 24. The metal pad 25 is located at one end of the conductive pillar 23, and electrically connected with the conductive pillar 23. In an actual process, the via 21 is formed by etching the substrate from the active surface S of the substrate 20 to the back surface, and the redistribution layer 24 is formed after the core layer 26 is formed.

In an embodiment, the shape of an opening of the via 21 may be, but not limited to, circular. In other embodiments, the shape of the opening of the via 21 may also be an ellipse, a polygon and the like.

The conductive pillar 23 is extended along a direction perpendicular to the substrate 20, and the material of the conductive pillar 23 includes at least one of copper or tungsten. In some embodiments, the width of the conductive pillar 23 is between 2 μm and 10 μm, and the depth of the conductive pillar is between 5 μm and 100 μm.

In an embodiment, an extension direction of the core layer 26 is the same as an extension direction of the conductive pillar 23, and the core layer 26 is located on a central axis of the conductive pillar 23. In this way, the core layer 26 may more uniformly alleviate the stress generated by the conductive pillar 23 during the thermal expansion. In a specific embodiment, the material of the core layer 26 includes polysilicon. But the material of the core layer is not limited to this, and any materials with the Young modulus that satisfies the above requirements may be used as the material of the core layer 26 in the embodiment of the present application.

In an embodiment, the core layer 26 is extended from the upper surface of the conductive pillar 23 into the conductive pillar 23 but does not pass through the bottom of the conductive pillar 23, as shown in FIG. 2A. But the present application is not limited to this. In other embodiments, the core layer 26 is extended from the upper surface of the conductive pillar 23 to a bottom surface of the conductive pillar 23, namely, it passes through the conductive pillar 23.

In an embodiment, the core layer 26 is a circular pillar, and the diameter of the circular pillar is between 100 Å and 1000 Å. But the present application is not limited to this. In other embodiments, the core layer 26 may also be a rectangular pillar, and the side length of the rectangular pillar is between 100 Å and 1000 Å.

In an embodiment, the semiconductor structure further includes at least one buffer layer 27 between the substrate 20 and the conductive pillar 23. A Young modulus of the buffer layer 27 is less than that of the substrate 20. The buffer layer 27 may effectively buffering the stress exerted on the substrate 20 when the conductive pillar 23 is thermally expanded, therefore the effect of the stress in the substrate 20 on the performance of the device distributed around the via 21 is reduced.

In an embodiment, the material of the buffer layer 27 is the same as the material of the core layer 26. However, the present application is not limited to this, and any materials that satisfy the above requirements with respect to Young modulus may be used as the material of the buffer layer 27 in the embodiment of the present application.

In the semiconductor structure shown in FIG. 2A, two buffer layers 27, namely the buffer layer 27a and the buffer layer 27b, are arranged. But the present application is not limited to this. In other embodiments, the number of the buffer layers 27 may also be other numerical values. It should be understood that the more buffer layers are provided, the better the stress buffering. However, too many layers may increase the complexity of the process, so the number of the buffer layers 27 should not be too many. In some specific embodiments, the number of the buffer layers 27 is between 1 and 3, and the thickness of each of the buffer layer 27 is between 100 Å and 500 Å.

In some embodiments, a plurality of the buffer layers 27 are provided. The semiconductor structure further includes a first insulating layer 28. The first insulating layer 28 is located between any two adjacent buffer layers among the plurality of the buffer layers 27, and the first insulating layer 28 is configured to isolate the adjacent buffer layers 27, so as to improve the stress buffering effect of the buffer layer 27. The material of the first insulating layer 28 includes but is not limited to oxide.

In an embodiment, the semiconductor structure further includes a second insulating layer 22 arranged in the via 21. The second insulating layer 22 is located between the substrate 20 and the buffer layer 27. The second insulating layer 22 is configured to electrically isolate the substrate 20 from any conductive materials in the via 21, and prevent the conductive material from migrating into the substrate 20. The second insulating layer 22 includes but is not limited to oxide. The thickness of the second insulating layer 22 is 2000 Å to 5000 Å.

In an embodiment, the semiconductor structure further includes a barrier layer 29 arranged in the via 21. The barrier layer 29 is located between the buffer layer 27 and the conductive pillar 23, and the barrier layer 29 covers an outer wall of the conductive pillar 23. The barrier layer 29 is configured to prevent the conductive material in the conductive pillar 23 from migrating into the substrate 20. The material of the barrier layer 29 includes at least one of tantalum or titanium.

It may be understood that a preset area around the via 21 is usually set as a Keep Out Zone (KOZ) 31. The semiconductor devices such as a transistor are not formed in the KOZ 31. A purpose of arranging the KOZ 31 in the substrate 20 is to prevent the semiconductor devices distributed near the via 21 from being adversely affected by the stress in the substrate 20. In the embodiment of the present application, by arranging the core layer 26 and the buffer layer 27 in the via 21, the stress in the substrate 20 may be effectively relieved, so the area of the KOZ 31 may be effectively reduced, and thus the utilization rate of the substrate 20 is improved.

Figure 2B:
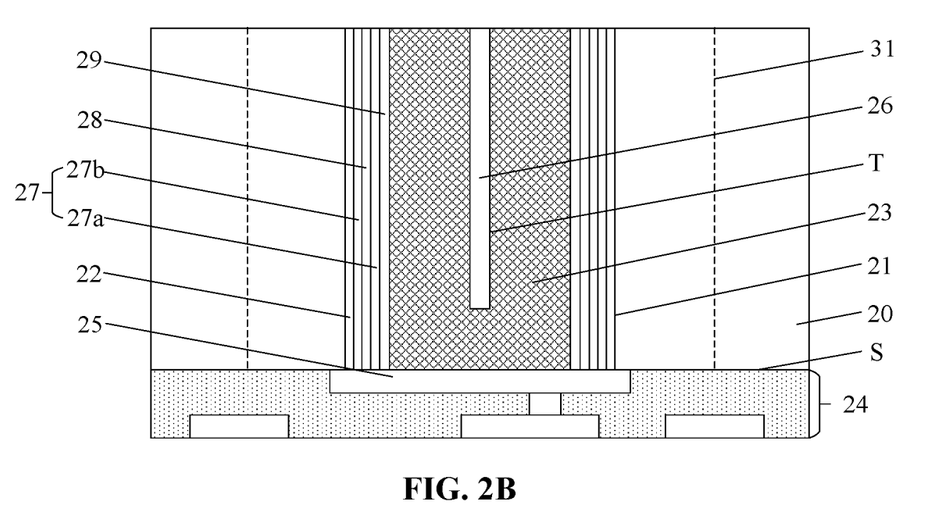
FIG. 2B is a schematic diagram of a semiconductor structure according to another embodiment of the present application.

The via 21 shown in FIG. 2A is formed by etching the substrate from the active surface S of the substrate 20 to the back surface. In other embodiments of the present application, the via 21 may also be formed by etching the substrate from the back surface of the substrate 20 to the active surface S, as shown in FIG. 2B. In this embodiment, before the via 21 is formed, a redistribution layer 24 is formed on the active surface S of the substrate 20. Then, the via 21 is formed by etching the substrate from the back surface of the substrate 20 to the active surface S. After that, a second insulating layer 22, a buffer layer 27b, a first insulating layer 28, a buffer layer 27a, a barrier layer 29, a conductive pillar 23, and a core layer 26 are sequentially formed in the via 21, the above layers are already described in the previous embodiments, and the detailed description thereof will be omitted.

Figure 3:
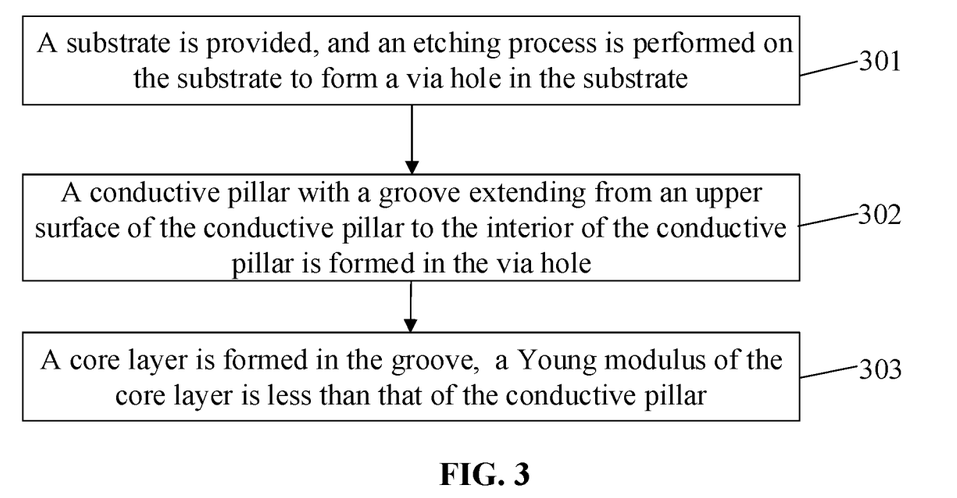
FIG. 3 is a flow block diagram of a manufacturing method for a semiconductor structure according to an embodiment of the present application.

An embodiment of the present application further provides a method for manufacturing a semiconductor structure. As shown in FIG. 3, the method includes the follows.

At S301, a substrate is provided, and an etching process is performed on the substrate to form a via in the substrate.

At S302, a conductive pillar with a groove is formed in the via, and the groove is extended from an upper surface of the conductive pillar to the interior of the conductive pillar.

At S303, a core layer is formed in the groove, a Young modulus of the core layer is less than that of the conductive pillar.

The method for manufacturing the semiconductor structure of the embodiment of the present application is further described in detail below with reference to FIGS. 4A-4E and FIGS. 5A-5C.

Figure 4A:
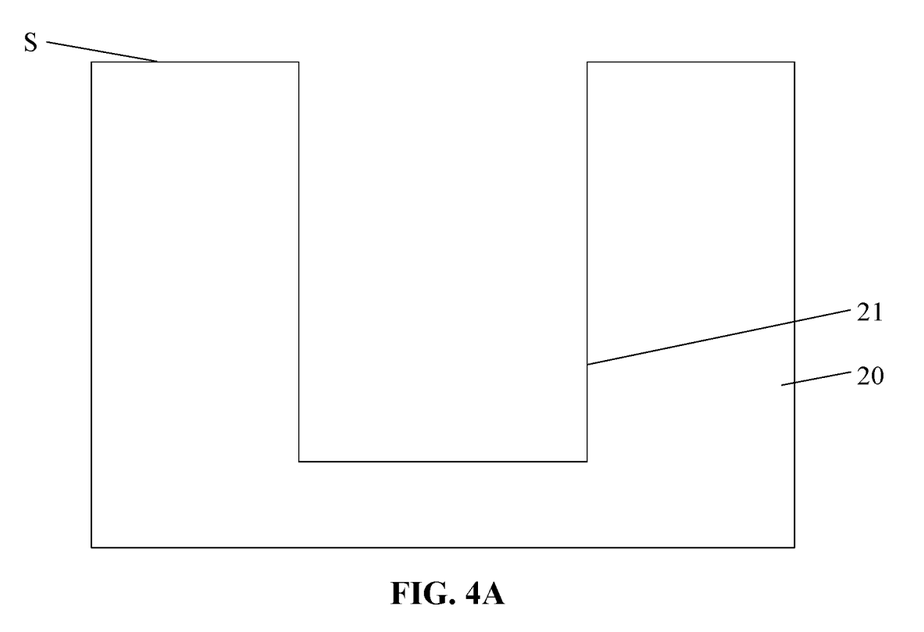
FIG. 4A is a first process flow diagram of a manufacturing method for a semiconductor structure according to an embodiment of the present application.

Firstly, the S301 is performed, the substrate 20 is provided, and the etching process is performed on the substrate 20 to form the via 21 in the substrate 20, as shown in FIG. 4A.

The substrate may be a silicon substrate. In some other embodiments, the substrate may include other semiconductor elements, such as germanium, or include semiconductor compounds, such as silicon carbide, gallium arsenide, gallium phosphide, indium phosphide, indium arsenide, and/or indium antimonide; or other semiconductor alloys, such as silicon germanium, gallium arsenide phosphide, indium aluminum arsenide, aluminum gallium arsenide, indium gallium arsenide, indium gallium phosphide, and/or indium gallium arsenide phosphide, or combinations thereof. In an optional embodiment, the thickness of the substrate is between 40 and 70 μm.

The substrate 20 includes an active surface S and a back surface opposite to the active surface S. A device is arranged in the substrate 20 adjacent to the active surface S. In an embodiment, the device may be a memory, such as a DRAM. But the present application is not limited to this, in other embodiments, the device may be a logic chip and the like.

Please refer to FIG. 4A, in an embodiment, the etching process is performed on the substrate 20 to form the via 21, which includes the following operations.

A patterned mask (unshown in the figure) is formed on the active surface S of the substrate 20, and the patterned mask is used as an etching mask for performing the etching process on the substrate 20. The substrate is etched from the active surface S to the interior of the substrate 20, and the via 21 that does not pass through the substrate 20 is formed.

In some embodiments, the shape of an opening of the via 21 may be circular. But the present application is not limited to this. In other embodiments, the shape of the opening of the via 21 may be an ellipse, a polygon and the like.

Figure 4B:
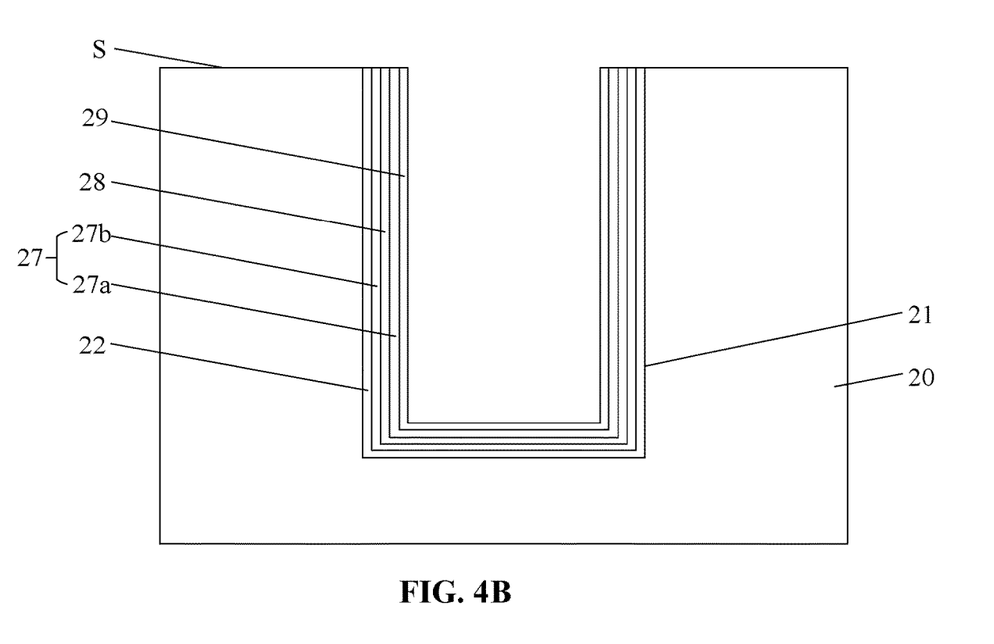
FIG. 4B is a second process flow diagram of a manufacturing method for a semiconductor structure according to an embodiment of the present application.
Figure 4C:
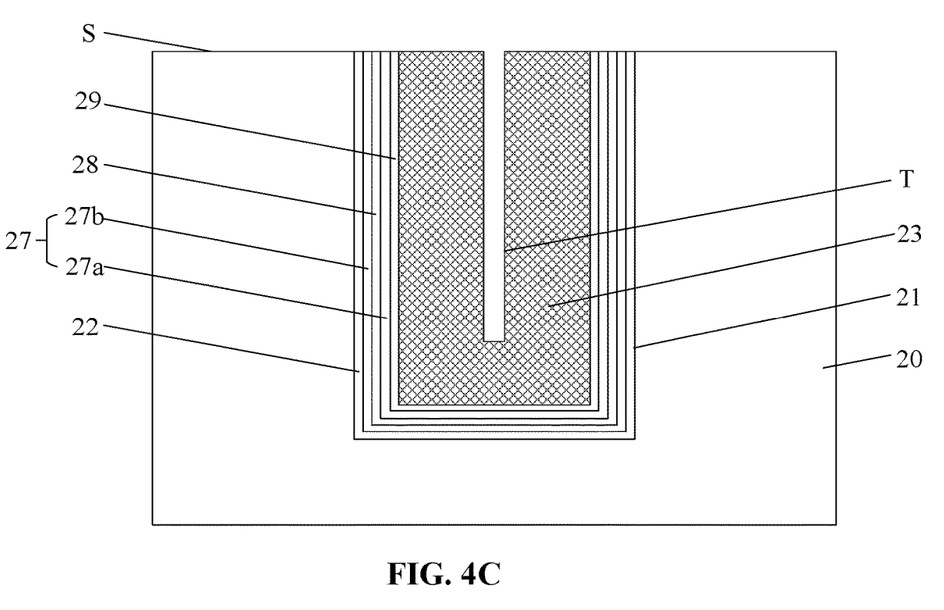
FIG. 4C is a third process flow diagram of a manufacturing method for a semiconductor structure according to an embodiment of the present application.

Next, the S302 is performed, a conductive pillar 23 with a groove T is formed in the via 21, and the groove T is extended from an upper surface of the conductive pillar 23 to the interior of the conductive pillar 23, as shown in FIGS. 4B-4C.

In an embodiment, before the conductive pillar 23 is formed in the via 21, the method further includes the following operations. At least one buffer layer 27 is formed between the substrate 20 and the conductive pillar 23, as shown in FIG. 4B. A Young modulus of the buffer layer 27 is less than that of the substrate 20, the stress generated by thermal expansion of the conductive pillar 23 on the substrate 20 can be effectively buffered, thereby the effect of the stress in the substrate 20 on the performance of the device distributed around the via 21 is reduced.

One or more buffer layers may be provided. It should be understood that the number of the buffer layers is greater, and the effect of the stress release that it may play is greater. It should be understood that the more buffer layers are provided, the better the stress buffering. However, too many layers may increase the complexity of the process, so the number of the buffer layers 27 should not be too many. In some specific embodiments, the number of the buffer layers is between 1 and 3, and the thickness of each layer of the buffer layer is between 100 Å and 500 Å.

In an embodiment, the material of the buffer layer includes polysilicon. But the present application is not limited to this, and any materials that satisfy the above requirement with respective to Young modulus may be used as material of the buffer layer in the embodiment of the present application.

In an embodiment, a plurality of the buffer layers 27, such as a buffer layer 27a and a buffer layer 27b, are provided. The method further includes the following operations. A first insulating layer 28 is formed between any two adjacent buffer layers among the plurality of the buffer layers 27, as shown in FIG. 4B. The first insulating layer 28 is configured to isolate the adjacent buffer layers 27 from each other, to improve the stress buffering effect of the buffer layer 27. The material of the first insulating layer 28 includes, but is not limited to, oxide.

In an embodiment, before at least one buffer layer 27 is formed between the substrate 20 and the conductive pillar 23, the method further includes the following operations. A second insulating layer 22 is formed between the substrate 20 and the buffer layer 27, as shown in FIG. 4B. The second insulating layer 22 is configured to electrically isolate the substrate 20 from any conductive materials in the via 21, and prevent the conductive material from migrating into the substrate 20. The material of the second insulating layer 22 includes, but is not limited to, oxide. The thickness of the second insulating layer 22 is 2000 Å to 5000 Å.

In an embodiment, after at least one buffer layer 27 is formed between the substrate 20 and the conductive pillar 23, the method further includes the following operations. A barrier layer 29 is formed between the buffer layer 27 and the conductive pillar 23, as shown in FIG. 4B. The barrier layer 29 is configured to prevent the conductive material in the conductive pillar 23 from migrating into the substrate 20. The material of the barrier layer 29 includes at least one of tantalum or titanium.

Please continue to refer to FIG. 4B, in a specific embodiment, the second insulating layer 22, the buffer layer 27b, the first insulating layer 28, the buffer layer 27a, and the barrier layer 29 are sequentially formed on a side wall and a bottom surface of the via 21. The above layers are formed by one or more thin film deposition processes. Specifically, the formation processes of each layer structure include, but are not limited to, a Chemical Vapor Deposition (CVD) process, a Plasma Enhanced Chemical Vapor Deposition (PECVD) process, an Atomic Layer Deposition (ALD) process or a combination thereof.

In an embodiment, the formation of the conductive pillar 23 with the groove T in the via 21 includes: a conductive material is deposited in the via 21, the deposition time of the conductive material is controlled to ensure that the conductive material does not completely fill the via 21, so as to obtain the conductive pillar 23 with the groove T.

In an embodiment, the formation of the conductive pillar 23 with the groove T in the via 21 includes: a conductive material is deposited in the via 21, and the conductive material completely fills the via 21; then a part of the conductive material is removed by etching, so as to obtain the conductive pillar 23 with the groove T.

In a specific embodiment, the conductive material is formed by a Physical Vapor Deposition (PVD) process or a Chemical Vapor Deposition (CVD) process. But the present application is not limited to this. In other embodiments, the conductive material may also be formed by electroplating.

The conductive pillar 23 is extended along a direction perpendicular to the substrate 20, and the material of the conductive pillar 23 includes at least one of copper or tungsten. In some embodiments, the conductive pillar 23 has a width of 2-10 μm, and a depth of 5-100 μm.

In an embodiment, the groove T is extended from an upper surface of the conductive pillar 23 into the conductive pillar 23 but does not pass through the bottom of the conductive pillar 23. But the present application is not limited to this. In other embodiments, the groove T is extended from the upper surface of the conductive pillar 23 to a bottom surface of the conductive pillar 23, namely it passes through the conductive pillar 23.

Figure 4D:
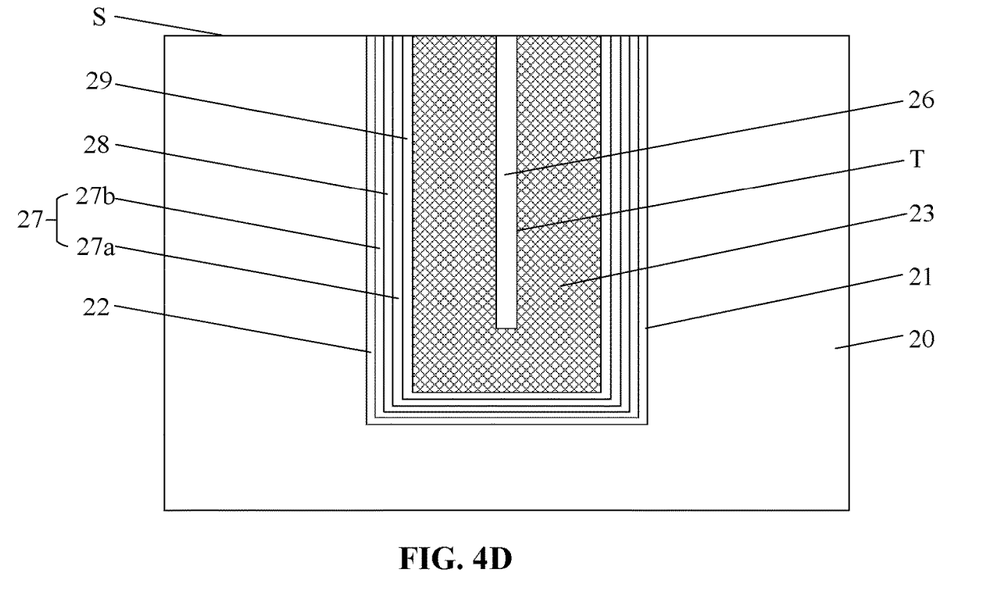
FIG. 4D is a fourth process flow diagram of a manufacturing method for a semiconductor structure according to an embodiment of the present application.

Next, the S303 is performed, and a core layer 26 is formed in the groove T, as shown in FIG. 4D. Herein, a Young modulus of the core layer 26 is less than that of the conductive pillar 23.

The core layer 26 completely fills the groove T. The formation processes of the core layer 26 include, but are not limited to, a CVD process, a PECVD process, an ALD process or a combination thereof.

In some embodiments, the core layer 26 is a circular pillar, and the diameter of the circular pillar is between 100 Å and 1000 Å. But the present application is not limited to this. In other embodiments, the core layer 26 may also be a rectangular pillar, and the side length of the rectangular pillar is between 100 Å and 1000 Å. The material of the core layer 26 includes polysilicon. But the present application is not limited to this, and any materials with Young modulus satisfying the above requirements with respect to Young modulus may be used as the material of the core layer 26 in the embodiment of the present application.

In an embodiment, an extension direction of the core layer 26 is the same as an extension direction of the conductive pillar 23, and the core layer 26 is located on a central axis of the conductive pillar 23. In this way, the core layer 26 may more uniformly alleviate the stress generated by thermal expansion of the conductive pillar 23.

Figure 4E:
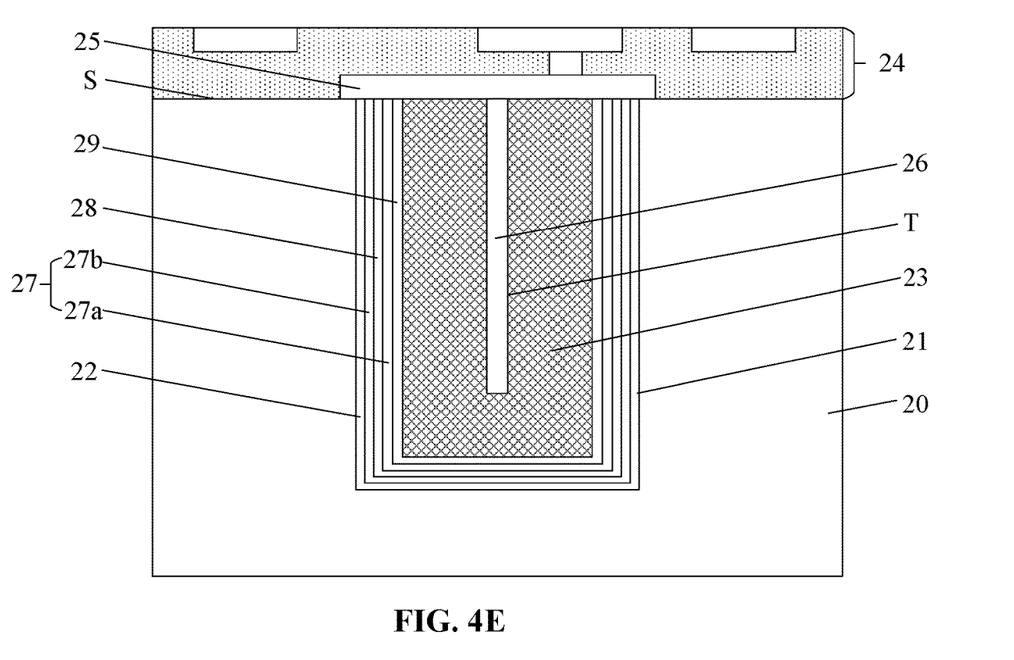
FIG. 4E is a fifth process flow diagram of a manufacturing method for a semiconductor structure according to an embodiment of the present application.

Please refer to FIG. 4E, in an embodiment, after the core layer 26 is formed in the conductive pillar 23, the method further includes the following operations. A redistribution layer 24 is formed on the active surface S, and a metal pad 25 is arranged in the redistribution layer 24. The metal pad 25 is deposited on the active surface S, and electrically connected with the conductive pillar 23.

In an embodiment, after the core layer 26 is formed in the conductive pillar 23, the method further includes the following operations. A thinning process is performed on the substrate 20, the thinning process is started from the back surface opposite to the active surface S until the conductive pillar 23 is exposed. Finally, the semiconductor structure is formed, as shown in FIG. 2A.

The via 21 shown in FIGS. 4A to 4E is formed by etching the substrate from the active surface S of the substrate 20 to the back surface. In another embodiment of the present application, the via 21 may also be formed by etching the substrate from the back surface of the substrate 20 to the active surface S, as shown in FIGS. 5A-5C.

Figure 5A:
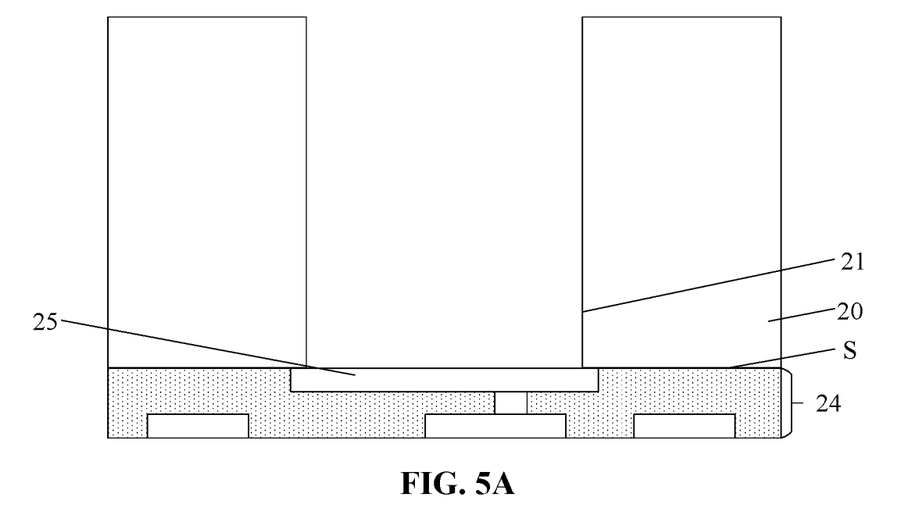
FIG. 5A is a first process flow diagram of a manufacturing method for a semiconductor structure according to another embodiment of the present application.

Referring to FIG. 5A, an etching process performed on the substrate 20 to form the via 21, includes: the substrate is etched from the back surface of the substrate 20 to the active surface S, to form the via 21 that passes through the substrate 20.

Specifically, before the via 21 is formed in the substrate 20, the method further includes the following operations. A redistribution layer 24 in which a metal pad 25 is arranged is formed on the active surface S. The metal pad 25 is deposited on the active surface S and is exposed through the via 21.

Figure 5B:
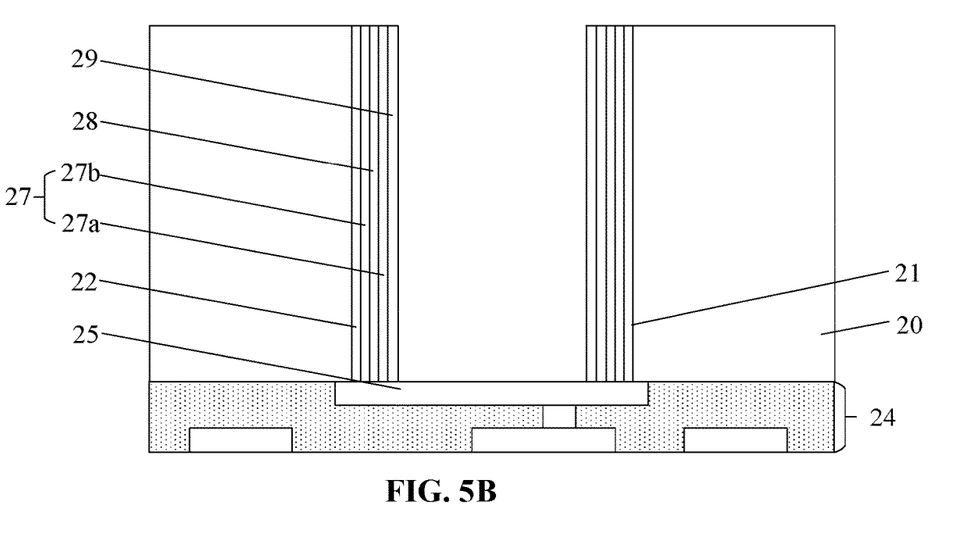
FIG. 5B is a second process flow diagram of a manufacturing method for a semiconductor structure according to another embodiment of the present application.
Figure 5C:
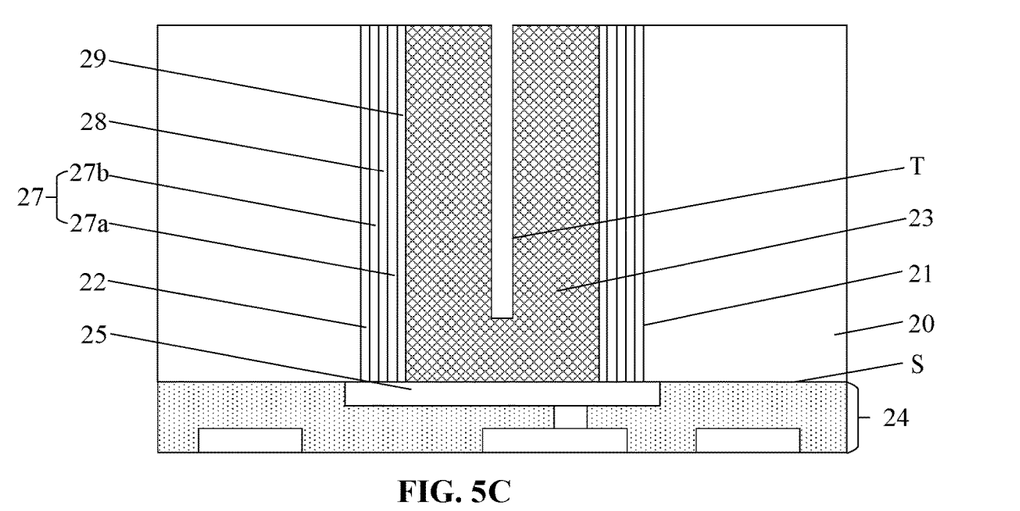
FIG. 5C is a third process flow diagram of a manufacturing method for a semiconductor structure according to another embodiment of the present application.

Next, as shown in FIG. 5B, the second insulating layer 22, the buffer layer 27b, the first insulating layer 28, the buffer layer 27a and the barrier layer 29 are sequentially formed on the side wall of the via 21 in the same way as the previous embodiments, and the detailed description thereof will be omitted.

Next, as shown in FIG. 5C, a conductive pillar 23 with a groove T is formed in the via 21, and the groove T is extended from the upper surface of the conductive pillar 23 to the interior of the conductive pillar 23.

Finally, a core layer 26 is formed in the groove T, and ultimately the semiconductor structure as shown in FIG. 2B is formed.

The above are only optional embodiments of the present application, and are not used to limit the scope of protection of the present application. Any modifications, equivalent replacements and improvements and the like made within the spirit and principle of the present application shall be included within the scope of protection of the present application.

What is claimed is:

1. A semiconductor structure, comprising:
a substrate and a via located in the substrate;
a conductive pillar located in the via, wherein the conductive pillar is provided with a groove extending inwards from an upper surface of the conductive pillar; and
a core layer located in the groove, wherein a Young modulus of the core layer is less than a Young modulus of the conductive pillar;
wherein the semiconductor structure further comprises at least one buffer layer located between the substrate and the conductive pillar, and a Young modulus of the buffer layer is less than a Young modulus of the substrate.

2. The semiconductor structure of claim 1, wherein the material of the core layer comprises polysilicon.

3. The semiconductor structure of claim 1, wherein the conductive pillar is extended along an extension direction perpendicular to the substrate, an extension direction of the core layer is the same as an extension direction of the conductive pillar, and the core layer is located on a central axis of the conductive pillar.

4. The semiconductor structure of claim 1, wherein the core layer is a circular pillar, a diameter of the circular pillar is between 100 Å and 1000 Å; or,
the core layer is a rectangular pillar, and a side length of the rectangular pillar is between 100 Å and 1000 Å.

5. The semiconductor structure of claim 1, wherein the number of the buffer layers is between 1 and 3, and a thickness of each buffer layer is between 100 Å and 500 Å.

6. The semiconductor structure of claim 1, wherein the material of the buffer layer is the same as the material of the core layer.

7. The semiconductor structure of claim 1, wherein the semiconductor structure comprises a plurality of the buffer layers;
the semiconductor structure further comprises a first insulating layer, wherein the first insulating layer is located between any two adjacent buffer layers among the plurality of the buffer layers.

8. The semiconductor structure of claim 1, wherein the semiconductor structure further comprises a second insulating layer arranged in the via, wherein the second insulating layer is located between the substrate and the buffer layer.

9. The semiconductor structure of claim 8, wherein a thickness of the second insulating layer is 2000 Å to 5000 Å.

10. The semiconductor structure of claim 1, wherein the semiconductor structure further comprises a barrier layer arranged in the via, wherein the barrier layer is located between the buffer layer and the conductive pillar.

11. The semiconductor structure of claim 10, wherein a material of the barrier layer comprises at least one of tantalum or titanium.

\* \* \* \* \*